(12) United States Patent
Boutros

(10) Patent No.: US 8,772,832 B2
(45) Date of Patent: Jul. 8, 2014

(54) GAN HEMTS WITH A BACK GATE CONNECTED TO THE SOURCE

(75) Inventor: Karim S Boutros, Moorpark, CA (US)

(73) Assignee: HRL Laboratories, LLC, Malibu, CA (US)

( * ) Notice: Subject to any disclaimer, the term of this patent is extended or adjusted under 35 U.S.C. 154(b) by 381 days.

(21) Appl. No.: 13/109,212

(22) Filed: May 17, 2011

(65) Prior Publication Data

US 2012/0211800 A1 Aug. 23, 2012

Related U.S. Application Data

(60) Provisional application No. 61/351,726, filed on Jun. 4, 2010.

(51) Int. Cl.
 *H01L 29/66* (2006.01)
 *H01L 31/06* (2012.01)

(52) U.S. Cl.
 USPC .... 257/194; 257/192; 257/201; 257/E29.246; 257/E29.249; 257/E29.252; 257/E21.403

(58) Field of Classification Search
 CPC ............ H01L 29/778; H01L 29/66431; H01L 29/66462; H01L 29/407; H01L 29/78648
 USPC .......... 257/192, 194, 201, E29.246, E29.249, 257/E29.252, E21.403
 See application file for complete search history.

(56) References Cited

U.S. PATENT DOCUMENTS

| | | | |
|---|---|---|---|
| 6,611,002 B2 * | 8/2003 | Weeks et al. | 257/94 |
| 7,026,665 B1 * | 4/2006 | Smart et al. | 257/190 |
| 7,038,252 B2 * | 5/2006 | Saito et al. | 257/192 |
| 7,498,618 B2 * | 3/2009 | Saito et al. | 257/194 |
| 7,566,913 B2 * | 7/2009 | Therrien et al. | 257/103 |

* cited by examiner

*Primary Examiner* — S. V. Clark
*Assistant Examiner* — Jesse Y Miyoshi
(74) *Attorney, Agent, or Firm* — Daniel R. Allemeier; George R. Rapacki

(57) ABSTRACT

The present invention reduces the dynamic on resistance in the channel layer of a GaN device by etching a void in the nucleation and buffer layers between the gate and the drain. This void and the underside of the device substrate may be plated to form a back gate metal layer. The present invention increases the device breakdown voltage by reducing the electric field strength from the gate to the drain of a HEMT. This electric field strength is reduced by placing a back gate metal layer below the active region of the channel. The back gate metal layer may be in electrical contact with the source or drain.

11 Claims, 5 Drawing Sheets

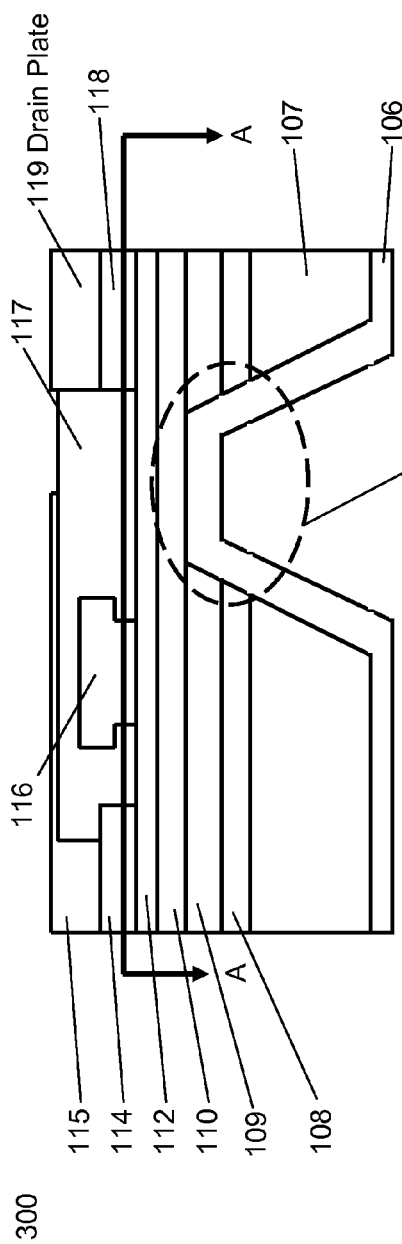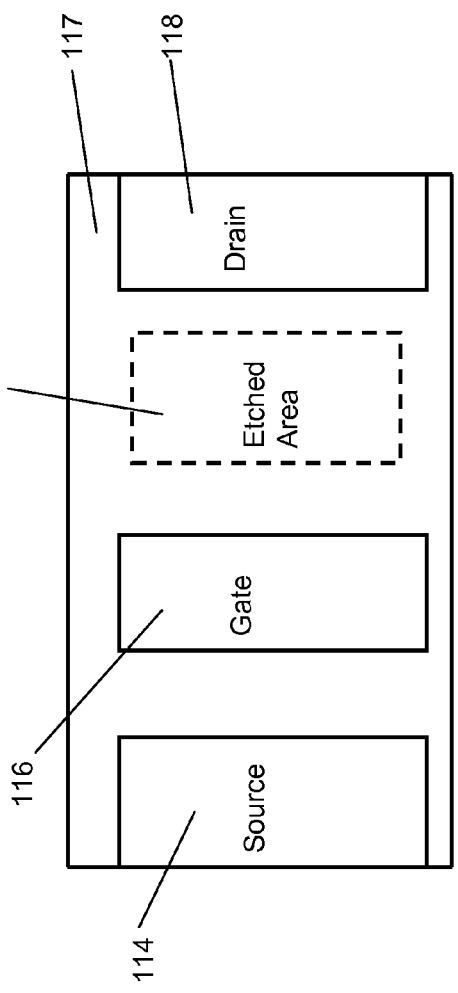
Fig 3A
Section A_A
Fig 3B

GAN HEMTS WITH A BACK GATE CONNECTED TO THE SOURCE

This application claims priority to provisional application 61/351,726 filed Jun. 4, 2010 titled "GaN HEMTs with a Back Gate Connected to the Source". Provisional application 61/351,726 is incorporated by reference herein.

FIELD OF THE INVENTION

The present invention relates to the area of fabrication of Gallium Nitride High Electron Mobility Field Effect Transistors (HEMT), also known as heterostructure FETs (HFETs) or modulation-doped FETs (MODFETs), where the source or drain may be electrically connected to a back gate below the active region of the channel.

BACKGROUND OF THE INVENTION

HEMT devices, particularly those made of GaN may be used to switch large voltages. One shortcoming of these devices is preventing short circuiting between the gate and drain through the barrier region. If the electric field between the gate and the drain in the barrier layer is too great the barrier layer breaks down and the device shorts. Another problem is carbon in the nucleation and buffer layers below the gate decrease the switching speed of the device. This shows up in the dynamic on resistance of the device. The dynamic on resistance is the resistance between two terminals when a device is switching from off to on.

SUMMARY OF THE INVENTION

This disclosure describes a structure and method to reduce the dynamic on resistance of a HEMT device and to increase the breakdown voltage between the gate and drain.

One preferred embodiment of the principles of the invention is a HEMT device comprising a substrate, a buffer layer, a channel layer, a barrier layer, a source, gate and drain disposed on the barrier layer. In addition, the HEMT device comprises a back gate metal layer disposed on an underside of the substrate with a void in the buffer layer and substrate below an active region between the gate and the drain. Furthermore, the source is electrically connected to the back gate metal layer.

An alternative embodiment based on the prior embodiment comprises a nucleation layer between the substrate and the buffer layer. The void in the active region between the gate and the drain includes the nucleation layer. This embodiment may comprise a conductive plating on the surfaces of the substrate and buffer layer exposed by the void below the active region between the gate and drain. The conductive plating may be metal and may be electrically connected to the back gate metal layer.

The channel layer in the previously described embodiments may comprises a combination of a Group III and a Group V material, preferably GaN. In addition, the previously described embodiments may comprise an insulating cap layer.

In an alternative embodiment of the principles of the invention comprises a method of fabricating HEMT devices with the carbon containing region between the gate and drain, below the channel layer removed and replaced with a back gate metal layer. The method of forming a HEMT device comprising receiving a substrate with a buffer layer, a channel layer, a barrier layer formed on a top side of the substrate thereon. Forming a source, a drain and a gate on the barrier layer then etching the underside of the substrate through the buffer layer to form a void in a region between the gate and the drain. This method may comprise adding a nucleation layer between the substrate and the buffer layer and etching the void through the nucleation layer.

The previously described method may further comprise forming a back gate metal layer on the underside of the substrate, on an underside of the channel layer and on edges of the nucleation layer and buffer layer exposed by the formation of the void in the region between the gate and drain. Furthermore this method may further comprise forming a source field plate on the HEMT device connected to the source and connected to the back gate metal layer. The channel layer in this method comprise GaN or another Group III-Group V material.

BRIEF DESCRIPTION OF THE DRAWINGS

The accompanying drawings, together with the specification, illustrate exemplary embodiments of the present invention, and, together with the description, serve to explain the principles of the present invention.

FIG. 3A: Side view of the device illustrating an embodiment of the principles of the invention.

FIG. 3B: Top section A-A view of the device in FIG. 3A.

DETAILED DESCRIPTION

Although embodiments of the present invention are applicable to many different devices, they are particularly applicable to microwave and millimeter power GaN transistors and high-voltage switching GaN transistors.

In the following detailed description, only certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, and not restrictive.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and or sections, these elements, components, regions, layers and or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of idealized embodiments of the invention. It is understood that many of the layers will have different relative thicknesses compared to those shown. Further, variations from the shapes of the illustrations as a result, for example, of manufacturing techniques and or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention. Like numbered elements are the same across figures, i.e. 110 in FIG. 3 is the same as 110 in FIG. 1.

Figure 1:
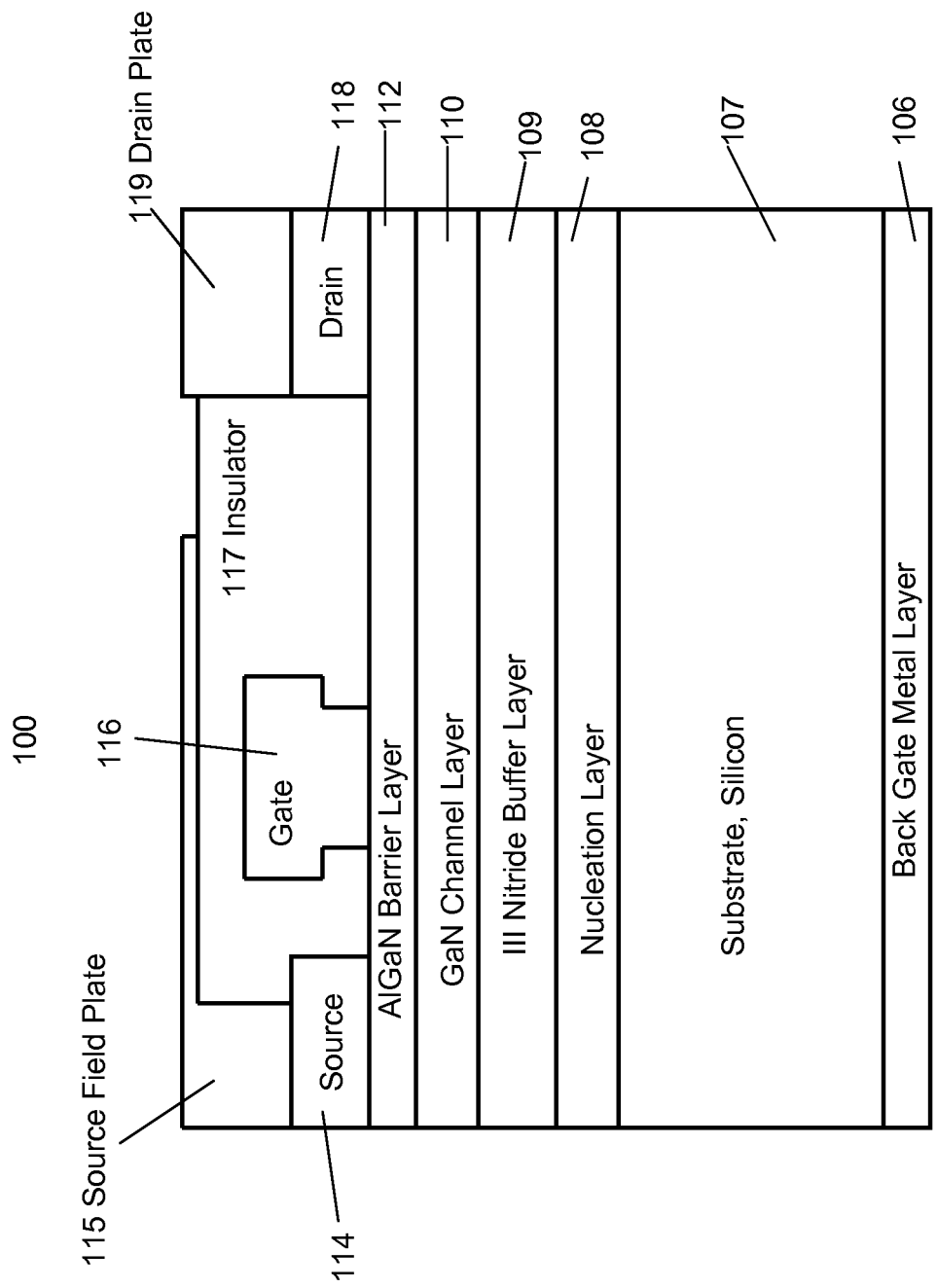
FIG. 1: Structure of prior art FETs.

FIG. 1 shows a typical cross section of a HEMT device comprising a substrate 107, an optional nucleation layer 108, a buffer layer 109, a channel layer 110, a barrier layer 112 plus the usual source 114, gate 116 and drain 118. The back gate 106 metal layer may be electrically connected to the source 114 or the source field plate 115. The gate 116 may be encapsulated in an insulating cap layer 117.

In the prior art the gate 116 typically consists of a top gate structure only. The source 114 may be connected to the back of the silicon substrate 107 through a conductive via (not shown) to the back gate metal layer 106. The silicon substrate 107 may be thinned down to a thickness of the order of 100 microns, but remains under the active region of the device.

The active region of the device is the area between the source 114 and drain 118 and includes the barrier layer 112, the channel layer 110, the buffer layer 109 and the nucleation layer 108. Conduction between the source 114 and drain 118 occurs in the channel layer. The off mode conductivity of the device is determined by the breakdown field strength of the barrier layer 112 between the drain 118 and the gate 116. The breakdown field strength in the active region between the gate 116 and the drain 118 is determined by the composition of the barrier layer 112 in this region. Moreover, the active region may contain defects such as a high concentration of carbon in the nucleation layer 108. These defects manifest themselves as increased dynamic on resistance. The dynamic on resistance is the resistance between the gate 116 and drain 118 when the device is switched from off to on.

A nucleation layer 108 may be added to reduce the lattice mismatch between the substrate 107 and the buffer layer 109. In effect, the nucleation layer 108 acts as a transition between the substrate 107 and the buffer layer 109. The nucleation layer 108 may comprise, by way of example and not limitation, AN or AlGaN. The thickness of the nucleation layer 108 may be between 10 and 50 nm.

GaN devices, as shown in FIG. 1, generally possess a nucleation layer 108 between the substrate and the buffer layer to provide a crystallographic transition between the substrate 107 and the buffer layer 109, which may have different crystal structures. The nucleation layer 108 and buffer layer 109 may be $Al_xGa_{1-x}N$ $0<=x<=1$ and have defects. Defects in the nucleation layer 108 may comprise carbon in the interstitials, Oxygen vacancies, Gallium vacancies, or Gallium interstitials. The defects in the nucleation layer 108 create a counter electric field that must be overcome before conduction occurs. The counter electric field is overcome by supplying charge carriers to the buffer layer 109 to negate the counter electric field. Once the counter electric field is negated then more carriers are available for conduction by the channel layer 110 and the on resistance reaches steady state. In addition, by reducing the counter electric field, more carriers are available earlier for conduction.

Continuing with FIG. 1, since the counter electric field must be overcome before carriers are available for the channel layer, the gate to drain resistance may be reduced by eliminating the causes of reduced carriers in the barrier region. In particular, by removing through etching the substrate 107, the buffer layer 109 and the nucleation layer 108 below the channel layer 110 at least between the gate 116 and drain 118.

The off mode breakdown voltage is the voltage between the gate 116 and the drain 118 that results in a breakdown of the barrier layer 112 and/or channel layer 110. Defects in the nucleation layer 108 do not directly affect the breakdown voltage. But steps to ameliorate the effect of defects in the nucleation layer 108 allow steps to reduce the peak electric field between the gate 116 and drain 118.

Figure 2:
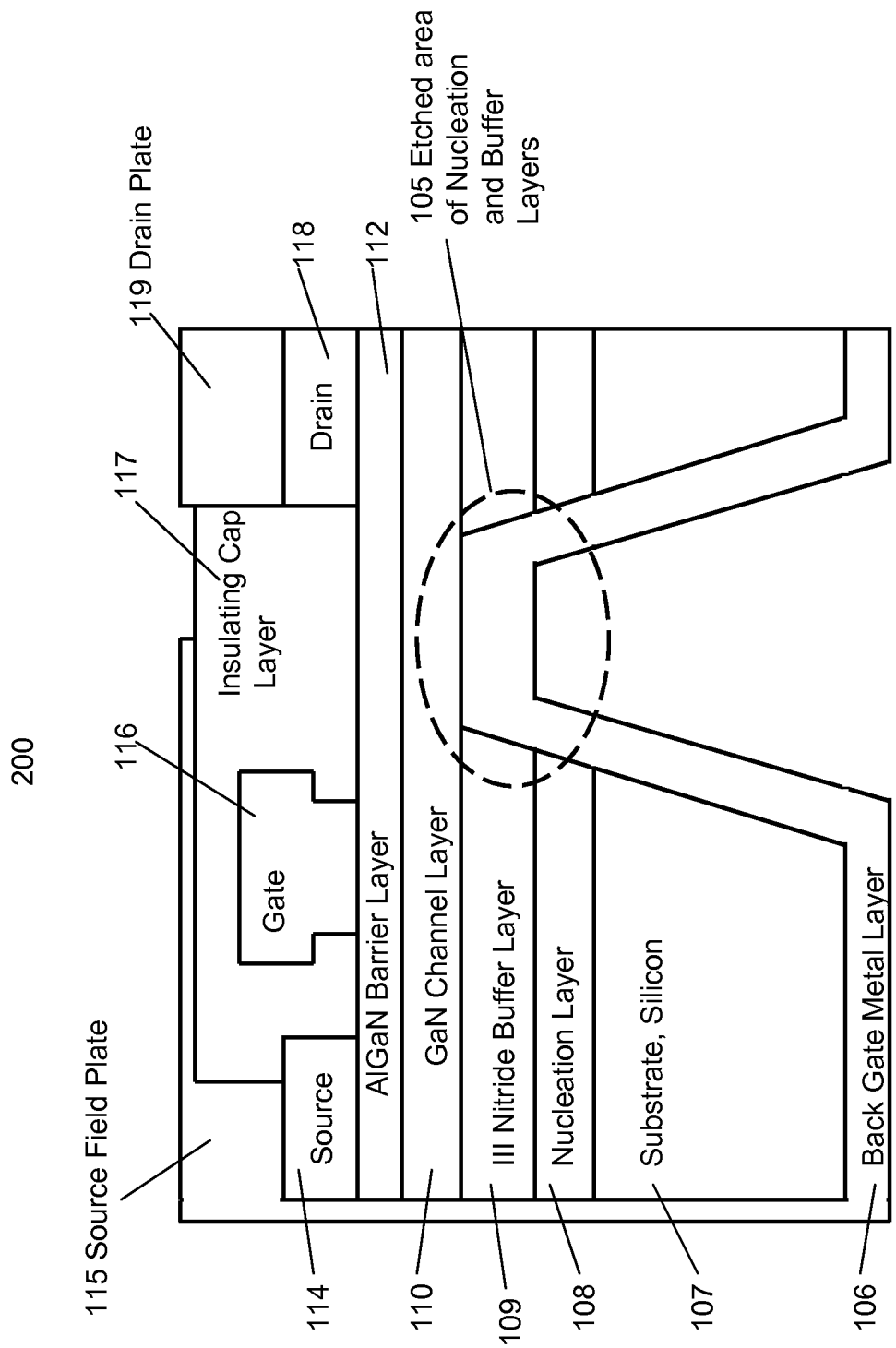
FIG. 2: Side view of the device illustrating an embodiment of the principles of the invention.

In view of the prior art in FIG. 1, the purpose of this invention is two fold: (1) reduce the high dynamic resistance in high voltage GaN FET devices by removing the carbon containing region that depletes the carriers available for conduction, and (2) plating the region removed with metal to form a back gate metal layer 106. As shown in FIGS. 2 and 3, the back gate metal layer 106 may be positioned in the high electric field region of the device to act as a reducer of the peak electric field in this region. These two actions, removal of the nucleation layer 108 and buffer layer 109 in selected regions and plating those regions with metal allow achieving a low dynamic on-resistance and a high breakdown voltage compared to devices known in prior art.

Figure 4:
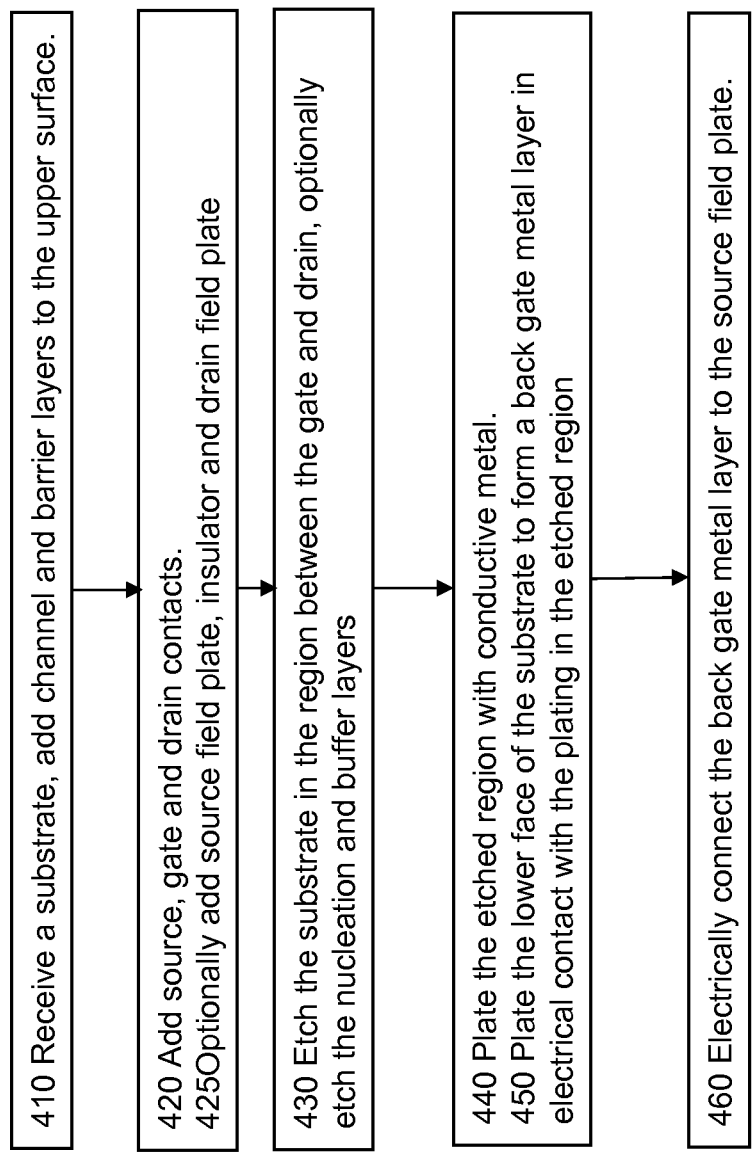
FIG. 4: Method of fabrication of a GaN HEMT with a Back Gate.
Figure 5:
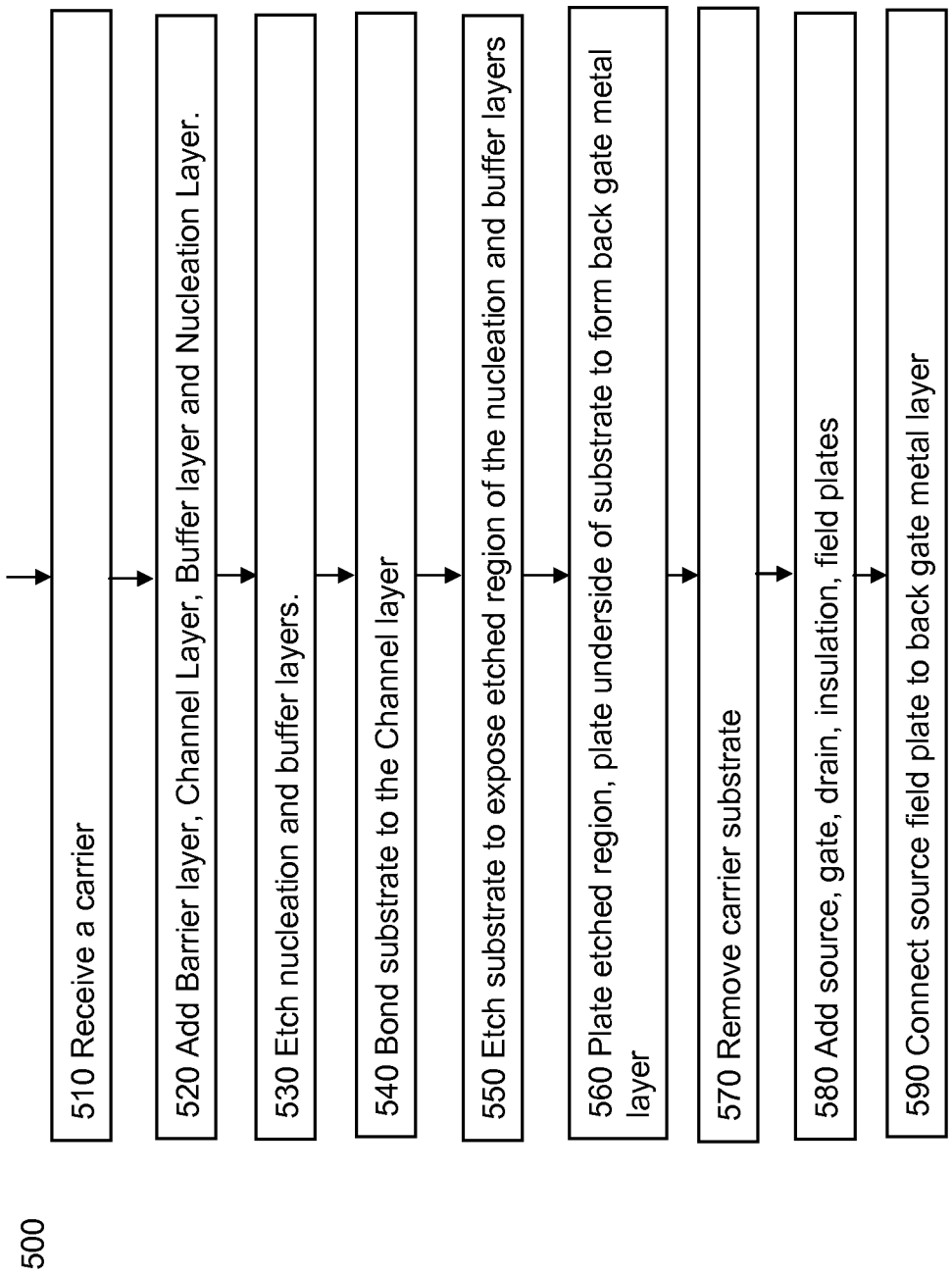
FIG. 5: Alternative method of fabrication of GaN HEMT with a Back Gate.

The principles of this invention are illustrated in the device of FIG. 2 and methods of forming the device structure are illustrated in FIGS. 4 and 5 that lead to reduced dynamic on-resistance and improved breakdown voltage. Both performance improvements are achieved with the same process. The structure in FIG. 2 is obtained by removing the carbon-containing regions, namely the nucleation layer 108 and buffer layer 109 of the device 200. In one embodiment, removal is done by etching selected regions 107, 108, and 109 from the backside of the wafer and subsequently plating with metal the etched region 105 and forming an electrical contact connecting the metal plated etched region 105 with the source 114 of the device. The metal plated etched region 105 forms an effective back gate metal layer 106 to the high electric field region between the gate 116 and drain 118 in the barrier layer 112 because of its close proximity to this region and its connection to the source field plate 115. The close proximity of the back gate metal layer 106 to the high electric field region leads to the reduction of the peak electric field in this region, thereby increasing the breakdown voltage of the device 200.

The dynamic on resistance is reduced because removing the source of the counter field in the active region allows more carriers to be available for conduction in the channel layer 110.

In a preferred embodiment shown in FIG. 3A, the substrate 107, nucleation layer 108 and buffer layer 109 are removed. These layers may be removed through etching and through plasma etching.

Etching is a well known technique for removal of material. The etching may be selective by masking the device before etching. The etching may be performed in two or more steps. By way of example and not limitation, the substrate 107 may be etched with CF4 or SF6, then the nucleation layer 108 and buffer layer 109 may be etched with chlorine. Etching the substrate will end once the nucleation layer 108/buffer layer 109 is reached. The etching depth of the nucleation 108 or buffer layer 109 is controlled by timing the etch and by choice of etchant.

For chlorine etching of the nucleation layer 108 or buffer layer 109 where the etching depth is on the order of microns, the etching time is between 1 and 100 minutes, without implying a limitation.

FIG. 3B shows a cut away view from the top of the device 300 in FIG. 3A. The etched area 105 is shown by the dotted box. The etched area 105 is not necessarily of the entire substrate 107, nucleation layer 108 and buffer layer 109 of the device 300.

The method to construct a device 200 or 300 may be used after the completed device is built as in FIG. 4, or the etching may be done after the barrier and channel layers are added as in FIG. 5. In FIG. 4 a device 200 or 300 is built on a substrate then etched to create the back gate metal layer 106 near the drain 118.

In FIG. 5 the device layers are added in reverse order from that described in FIG. 4 by starting with a carrier and building up from the carrier. Once all the device layers are present the substrate 107, nucleation layer 108 and buffer layer 109 are etched away in a selected region 105. Then the carrier is removed and the device 200 or 300 is completed.

Normally, connecting the source 114 with a via to the back of the silicon substrate 107 will not affect the breakdown voltage or the dynamic on resistance because the back gate metal layer 106 is too far from the active region of the device 200 or 300. However, by etching the substrate 107, nucleation layer 108 and buffer layer 109 and then forming a back gate metal layer 106, the peak electric field is reduced through the proximity of the back gate metal layer 106.

In addition, the Off mode breakdown voltage may be increased by reducing the magnitude of the electric field between the gate 116 and drain 118. The peak electric field between the gate 116 and drain 118 may be reduced by adding a back gate metal layer 106, below the channel layer 110 and between the gate 116 and drain 118, to the source 114.

The typical time constant of the On resistance is on the order of 100 millisecond to 100 microsecond. By etching the nucleation layer 108 and buffer layer 109 the time constant may be reduced to less than 100 nanosecond.

Etching away the nucleation layer 108 and buffer layer 109 does not affect the breakdown electric field strength in the off mode. This electric field is between the gate 116 and drain 118. If the field gets too strong, the barrier layer 112 shorts out at the interface between the barrier layer 112 and the insulating cap layer 117, between the gate 116 and drain 118. The peak electric field occurs at the edge of the gate 116 nearest the drain 118. By adding backside metal in the region 105 between the gate and drain, connected to the source 114, the peak electric field at the gate 116 is reduced.

Although practiced with GaN materials, this is not to imply a limitation. The techniques and methods above may be practiced with other combinations of a Group III material and Group V materials. Typical Group III materials include Gallium and Indium. Group V materials include Nitrogen, Phosphorus, Arsenic, and Antimony. Channel layer 110 materials include, by way of example and not limitation, GaN, InGaN and AlInGaN. Alternative insulating cap layer 117 materials include, by way of example and not limitation, AN, AlInN, AlGaN, and AlInGaN.

The channel layer 110 and barrier layer 112 have been described as single homogeneous layers by example only, and not to imply a limitation. The various layers described may comprise multiple layers of the materials described above.

A method to fabricate the devices 200 and 300 is described in FIG. 4. This method essentially starts with a complete device and selectively removes material to form the device 200 or 300. Specifically, the method 400 begins 410 with receiving a substrate, adding a channel layer and barrier layer to the upper surface. The substrate may comprise a nucleation layer and a buffer layer on the upper surface. In step 420 the source, gate and drain contacts are added to complete the devices 200 and 300. Optional step 430 may add a source field plate, drain field plate and insulating cap layer. Next, in step 430 the substrate, and optionally the nucleation and buffer layers are etched away in the region between the gate and drain. In step 440 the etched region is plated with a conductive material such as a metal. The lower face of the substrate may also be plated with metal for example to form a back gate metal layer. The back gate metal layer may be in contact with the plating in the etched region between the gate and drain. Finally, the back gate metal layer may be electrically connected to the source field plate as described in step 460.

An alternative method of forming a device 200 or 300 is illustrated in FIG. 5. In FIG. 5, the method is similar to that illustrated in FIG. 4 except it allows for more parallel operations through the use of a carrier. As shown in FIG. 5, devices 200 or 300 may be constructed by starting 510 with a carrier. Next in step 520 the barrier layer, channel layer, buffer layer and nucleation layers are added. In step 530 the buffer and nucleation layers are etched away in the region between the expected gate and drain. Optionally in parallel with building up the carrier layer, a substrate may be formed with etched regions corresponding to the etched regions in the buffer and nucleation layers. The substrate is bonded to the remaining nucleation layer on the carrier in step 540. If not already etched away, the substrate is etched in the region between the expected gate and drain in step 550. In step 560 the etched region between the gate and drain as well as the underside of the substrate may be plated with a conductor, preferably metal to form a back gate metal layer. The carrier is removed in step 570 and contacts to the source, gate and drain as well as an insulating cap layer and field plates are added in step 580. Finally in step 590 the back gate metal layer is connected to the source field plate added in step 580.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

The invention claimed is:

1. A HEMT device comprising:
    a substrate, a buffer layer, a channel layer, and a barrier layer;
    a source, a gate, and a drain disposed on the barrier layer;
    a void in the buffer layer and substrate below an active region between the gate and the drain;
    a back gate metal layer disposed on an underside of the substrate;
    the source is electrically connected to the back gate metal layer;
    a conductive plating on the surfaces of the substrate and buffer layer exposed by the void below the active region between the gate and drain.

2. The device of claim 1 further comprising a nucleation layer between the substrate and the buffer layer; the nucleation layer comprising a void in the active region between the gate and the drain.

3. The device of claim 1 wherein the conductive plating comprises metal.

4. The device of claim 1 wherein the conductive plating is electrically connected to the back gate metal layer.

5. The device of claim 1 wherein the channel layer comprises a combination of a Group III and a Group V material 6. The device of claim 5 wherein the channel layer comprises GaN.

7. The device of claim 1 further comprising an insulating cap layer.

8. A method of forming a HEMT device comprising:
   receiving a substrate with a buffer layer, a channel layer, a barrier layer formed on a top side of the substrate thereon;
   forming a source, a drain and a gate on the barrier layer;
   etching the underside of the substrate through the buffer layer to form a void in a region between the gate and the drain;
   forming a back gate metal layer on the underside of the substrate, on an underside of the channel layer and on edges of the nucleation layer and buffer layer exposed by the formation of the void in the region between the gate and drain.

9. The method of claim 8 wherein the device further comprises a nucleation layer between the substrate and the buffer layer and wherein the void extends through the nucleation layer.

10. The method of claim 8 further comprising forming a source field plate on the HEMT device connected to the source and connected to the back gate metal layer.

11. The method of claim 8 wherein the channel layer comprises GaN.

* * * * *